(12) United States Patent
Hasegawa et al.

(10) Patent No.: US 6,690,599 B2
(45) Date of Patent: Feb. 10, 2004

(54) FERROELECTRIC MEMORY DEVICE

(75) Inventors: Kazumasa Hasegawa, Fujimi-cho (JP); Eiji Natori, Chino (JP); Hiromu Miyazawa, Toyoshina-cho (JP); Junichi Karasawa, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/026,892

(22) Filed: Dec. 27, 2001

(65) Prior Publication Data

US 2002/0159306 A1 Oct. 31, 2002

(30) Foreign Application Priority Data

| Dec. 27, 2000 | (JP) | 2000-397122 |
| Dec. 28, 2000 | (JP) | 2000-403227 |
| Dec. 28, 2000 | (JP) | 2000-403231 |
| Mar. 23, 2001 | (JP) | 2001-085747 |
| Dec. 26, 2001 | (JP) | 2001-393630 |

(51) Int. Cl.$^7$ ................................................ G11C 11/22
(52) U.S. Cl. ............................................ 365/145; 365/147
(58) Field of Search .................................. 365/145, 147

(56) References Cited

U.S. PATENT DOCUMENTS 5,753,934 A  5/1998 Yano et al. ............... 257/30
6,373,743 B1 * 4/2002 Chen et al. ............... 365/145

FOREIGN PATENT DOCUMENTS

| EP | 1 017 100 A1 | 7/2000 |
| JP | A 7-115141 | 5/1995 |
| JP | A 8-264525 | 10/1996 |
| JP | A 9-110592 | 4/1997 |
| JP | A 9-116107 | 5/1997 |
| JP | A 9-116111 | 5/1997 |
| JP | A 9-121032 | 5/1997 |
| JP | A 11-251518 | 9/1999 |
| JP | A 2000-269455 | 9/2000 |
| JP | A 2000-286396 | 10/2000 |

OTHER PUBLICATIONS

U.S. patent application Ser. No. 10/026,903, Hasegawa et al., filed Dec. 27, 2001.

* cited by examiner

*Primary Examiner*—M. Tran
(74) *Attorney, Agent, or Firm*—Oliff & Berridge, PLC

(57) ABSTRACT

A ferroelectric memory device includes a simple matrix type memory cell array. Provided that the maximum absolute value of a voltage applied between a first signal electrode and a second signal electrode is Vs, polarization P of a ferroelectric capacitor formed of the first signal electrode, the second signal electrode, and ferroelectric layer is within the range of $0.1P(+Vs)<P(-\frac{1}{3}Vs)$ when the applied voltage is changed from $+Vs$ to $-\frac{1}{3}Vs$, and $0.1P(-Vs)>P(+\frac{1}{3}Vs)$ when the applied voltage is changed from $-Vs$ to $+\frac{1}{3}Vs$.

21 Claims, 11 Drawing Sheets

FERROELECTRIC MEMORY DEVICE

Japanese Patent Application No. 2001-393630, filed on Dec. 26, 2001, is hereby incorporated by reference in its entirety.

TECHNICAL FIELD

The present invention relates to a ferroelectric memory device. More particularly, the present invention relates to a simple matrix type ferroelectric memory device.

BACKGROUND

A simple matrix type ferroelectric memory device using only ferroelectric capacitors instead of cell transistors has a very simple structure and enables a higher degree of integration. Therefore, development of such a memory device has been expected.

Japanese Patent Application Laid-open No. 9-116107 discloses technology relating to a simple matrix type ferroelectric memory device and an operation method therefor.

A method of writing and reading data disclosed in Japanese Patent Application Laid-open No. 9-116107 is described below. FIG. 9 is a view showing a memory cell array of a ferroelectric memory device.

The method of writing data is described below. FIG. 10 is a timing chart in the case of writing data "1" into a ferroelectric capacitor Cm,N and writing data "0" into Cm, N+1. In the technology according to Japanese Patent Application Laid-open No. 9-116107, the data "1" is written into a memory cell by applying a voltage in a direction so that the potential of a selected sub-bit line is higher than the potential of a selected word line. The data "0" is written into the memory cell by applying a voltage in a direction so that the potential of the selected sub-bit line is lower than the potential of the selected word line.

Main bit lines MBLN and MBLN+1 are set to a ground voltage (0 V) at a time t1. At the same time, a selection gate line SL is set to 5 V from 0 V, a selected word line WLm is set to a power supply voltage VCC (3.3 V), and all non-selected word lines WL1 to WLm are set to the ground voltage (0 V). This causes the contents of the ferroelectric capacitors Cm,N and Cm,N+1 to be erased (data "0" is written).

At a time t2, the selection gate line SL and the selected word line WLm are set to the ground voltage (0 V), the main bit line MBLN is set to the power supply voltage VCC (3.3 V), and the main bit line MBLN+1 is set to (⅓) VCC (1.1 V).

At a time t3, the selection gate line SL is set to 5 V, the selected word line WLm is set to the ground voltage (0 V), and the non-selected word lines WL1 to WLM are set to (⅔) VCC (2.2 V). This causes the data "1" to be written into the ferroelectric capacitor Cm,N.

At a time t4, the main bit lines MBLN and MBLN+1 are set to (⅓) VCC (1.1 V), and the selection gate line SL and the word lines WL1 to WLM are set to the ground voltage (0 V), whereby the write operation is completed.

The method of reading data is described below. FIG. 11 is a timing chart in the case of reading the data "1" stored in the memory cell Cm,N and reading the data "0" stored in the memory cell Cm,N+1, and rewriting the data "1" into the memory cell Cm,N and rewriting the data "0" into Cm,N+1.

At the time t1, a precharge signal φPC is set to the power supply voltage VCC (3.3 V), and a column select signal φ is set to 5 V. This causes the main bit lines MBLN and MBLN+1 to be precharged to a precharge voltage VPC (0 V) before time t2. The main bit lines MBLN and MBLN+1 are respectively connected to nodes VN and VN+1 of sense amplifiers.

At the time t2, the precharge signal φPC is dropped to 0 V, thereby causing the main bit lines MBLN and MBLN+1 to be in a floating state. The selection gate line SL is set to 5 V from 0 V, and the selected word line WLm is set to the power supply voltage VCC (3.3 V) from 0 V. This causes the ferroelectric capacitors Cm,N and Cm,N+1 to be in a polarization state in which the data "0" is written.

At the time t3, the selection gate line SL and the selected word line WLm are set to 0 V. At the time t4, a sense enable signal φSE is set to the power supply voltage VCC (3.3 V). This causes sense amplifiers SAN and SAN+1 to be activated. As a result, the data "1" is latched by the sense amplifier SAN before a time t5, whereby the potential of the main bit line MBLN is set to the power supply voltage VCC (3.3 V). The data "0" is latched by the sense amplifier SAN+1, whereby the potential of the main bit line MBLN+1 is set to the ground voltage (0 V). The read operation is performed in this manner.

Since steps after the time t5 are rewriting steps, description thereof is omitted.

SUMMARY

The present invention may provide a ferroelectric memory device with improved operability.

A ferroelectric memory device according to the present invention comprises:

a memory cell array, in which memory cells are arranged, in a matrix, which comprises first signal electrodes, second signal electrodes arranged in a direction which intersects with the first signal electrodes, and a ferroelectric layer disposed at least in intersecting regions in which the first signal electrodes intersect with the second signal electrodes, wherein, provided that the maximum absolute value of a voltage applied between one of the first signal electrodes and one of the second signal electrodes is Vs, a polarization value P of a ferroelectric capacitor comprising one of the first signal electrodes, one of the second signal electrodes, and the ferroelectric layer is within the range of:

$$0.1 P(+Vs) < P(-\tfrac{1}{3} Vs)$$

when the applied voltage is changed from +Vs to −⅓Vs, and $$0.1 P(-Vs) > P(+\tfrac{1}{3} Vs)$$

when the applied voltage is changed from −Vs to +⅓Vs.

The polarization P(+Vs) is positive when the applied voltage is +Vs, and the polarization P(−Vs) is negative when the applied voltage is −Vs.

The difference between the polarization corresponding to the data "0" and the polarization corresponding to the data "1" can be increased if the polarization of the ferroelectric capacitor satisfies the above conditions. As a result, the ferroelectric memory device can be operated reliably. Specifically, operability of the ferroelectric memory device can be improved.

The ferroelectric memory device of the present invention may have at least any of the following features.

(a) The ferroelectric layer may comprise a compound containing at least Sr, Bi, Nb, and O as constituent elements. In this case, the compound may have the formula:

$SrBi_xNb_yO_z$ wherein x may be 1.5 to 2.5, y may be 1.5 to 2.5, and z may be 7 to 11.

In this case, the compound may have the formula:

$SrBi_x(Ta_wNb_{1-w})_yO_z$ wherein x may be 1.5 to 2.5, y may be 1.5 to 2.5, z may be 7 to 11, and w may be 0 to 0.9.

(b) The ferroelectric layer may comprise a compound without 90° domain.

In this case, the ferroelectric layer may comprise a compound having a tungsten bronze type crystal structure.

In this case, the ferroelectric layer formed using the compound may have the strongest peak of an XRD diffraction line determined using a wide-angle method at the (001) plane.

(c) The ferroelectric layer may comprise a compound containing at least Pb, Ti, and O as constituent elements.

In this case, the ferroelectric layer may comprise a single phase compound.

(d) The ferroelectric layer may comprise a compound containing at least Pb, Ti, Zr, and O as constituent elements.

In this case, the compound may have the formula:

$Pb_x(Zr_{1-y}Ti_y)O_z$ wherein x may be 0.9 to 1.3, y may be 0.6 to 1.0, and z may be 2.8 to 3.4.

In this case, the crystal structure of the compound may belong to a tetragonal system.

The ferroelectric layer formed using the compound may have the strongest peak of an XRD diffraction line determined using a wide-angle method at the (001) plane.

(e) Information may be written into a selected memory cell by applying a write voltage between one of the first signal electrodes and one of the second signal electrodes in one of the memory cells, and an absolute value of the write voltage may be less than an absolute value of a saturation voltage at which the remanent polarization of the ferroelectric capacitor is saturated.

The difference between switching polarization and non-switching polarization can be increased by setting the absolute value of the write voltage less than the absolute value of the saturation voltage, in comparison with the case of setting the write voltage the same as the saturation voltage. Therefore, the difference in bit line potential between reading of first data and reading of second data can be increased, whereby malfunctions can be decreased.

The difference between the polarization corresponding to the data "0" and the polarization corresponding to the data "1" can be further increased for reasons described later, whereby the ferroelectric memory device can be operated more reliably.

In this case, information may be read from a selected memory cell by applying a read voltage between one of the first signal electrodes and one of the second signal electrodes in one of the memory cells, and an absolute value of the read voltage may be less than an absolute value of a saturation voltage.

The absolute value of the write voltage may be the same as the absolute value of the read voltage.

In this case, while information is read from the selected memory cell, part of the information may be simultaneously written into the memory cell.

(f) Information may be written into a selected memory cell by applying a write voltage between one of the first signal electrodes and one of the second signal electrodes in one of the memory cells, information may be read from a selected memory cell by applying a read voltage between one of the first signal electrodes and one of the second signal electrodes in one of the memory cells, and provided that the write voltage is ±Vs and the read voltage is one of +Vs and −Vs,

|Vs| may be less than an absolute value of a saturation voltage at which the remanent polarization of the ferroelectric capacitor is saturated.

(g) With regard to the polarization P of the ferroelectric capacitor,

P(0V)/P(Vs) may be greater than 0.6, when the applied voltage is changed from +Vs to −⅓Vs, and P(0V)/P(−Vs) may be greater than 0.6, when the applied voltage is changed from −Vs to +⅓Vs.

This enables the difference between the polarization corresponding to the data "0" and the polarization corresponding to the data "1" to be further increased for reasons described later. As a result, the ferroelectric memory device can be operated more reliably.

(h) The memory cell array may be integrated on a single substrate together with a peripheral circuit.

In this case, the ferroelectric memory device may further comprise a peripheral circuit section which selectively writes information into or reads information from the memory cells, wherein the memory cell array and the peripheral circuit section may be disposed in different layers.

This increases degrees of freedom relating to the formation position of the memory cell array and the peripheral circuit section.

At least interconnecting lines in the peripheral circuit section may be formed of Cu or an alloy containing Cu as an essential component.

DETAILED DESCRIPTION

An embodiment of the present invention is described below with reference to the drawings.

1. Structure of Ferroelectric Memory Device

Figure 1:
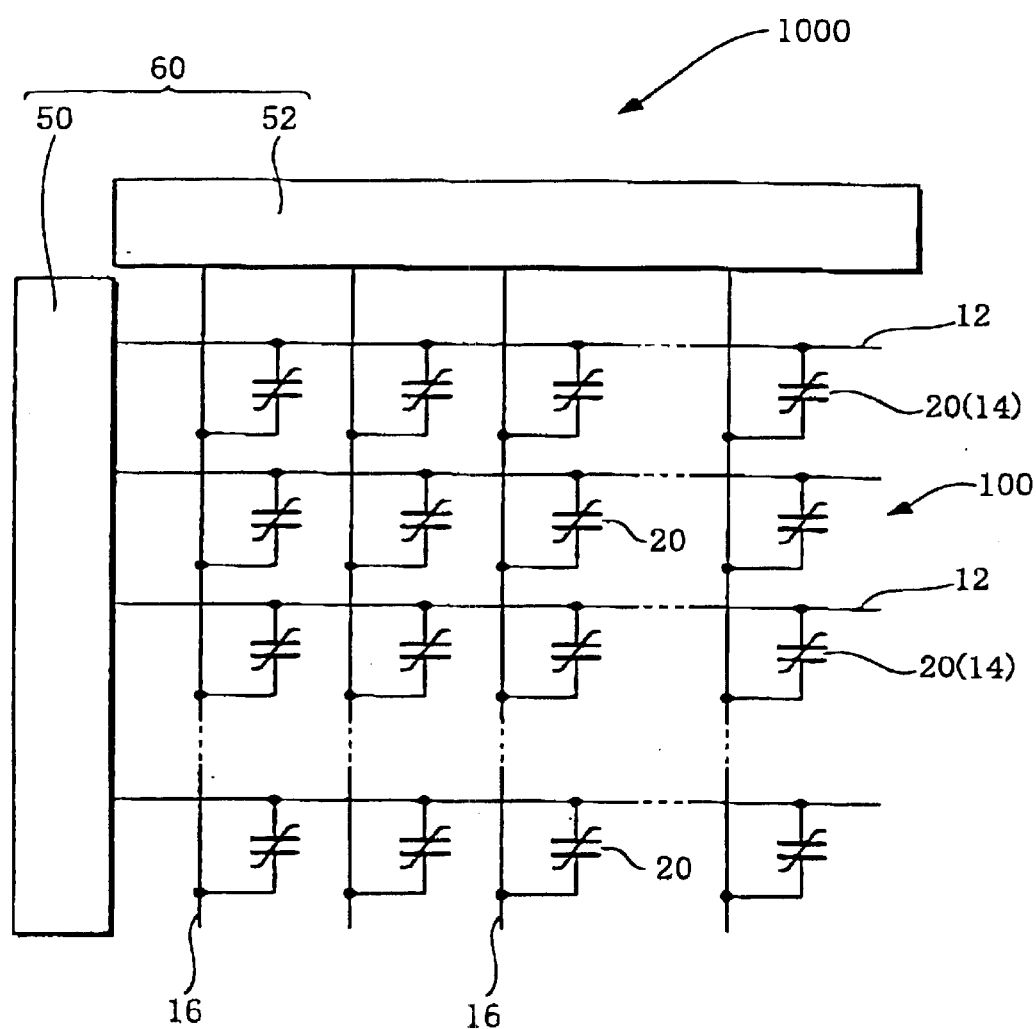
FIG. 1 is a plan view schematically showing a ferroelectric memory device.
Figure 2:
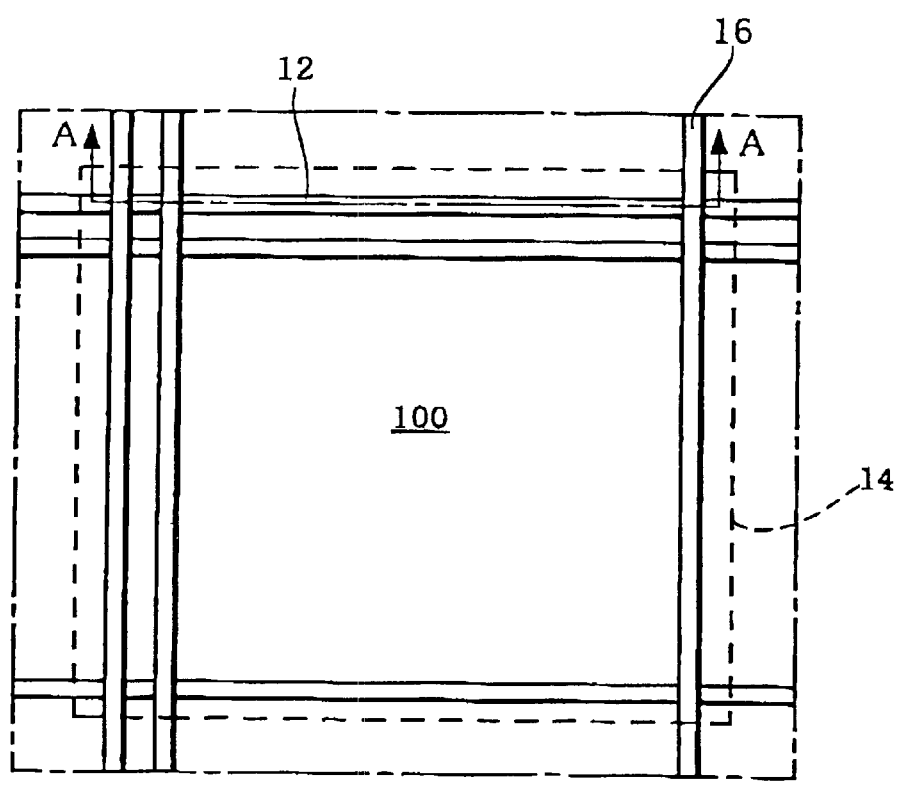
FIG. 2 is a plan view schematically showing a layout of the pattern of the ferroelectric memory device.
Figure 3:
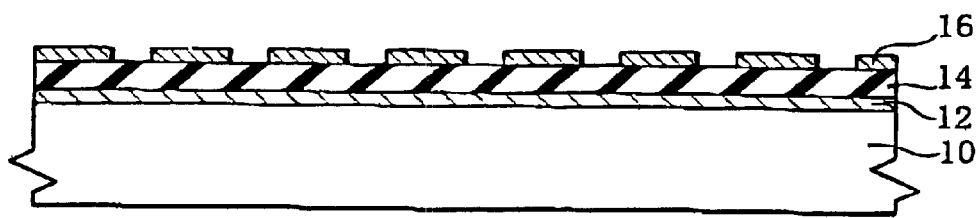
FIG. 3 is a cross-sectional view schematically showing part of the ferroelectric memory device along the line A—A shown in FIG. 2.

FIG. 1 is a plan view schematically showing a ferroelectric memory device. FIG. 2 is a plan view schematically showing a layout of the pattern of the ferroelectric memory device. FIG. 3 is a cross-sectional view schematically showing part of the ferroelectric memory device along the line A—A shown in FIG. 2.

A ferroelectric memory device 1000 of the present embodiment includes a memory cell array 100.

In the memory cell array 100, first signal electrodes (word lines) 12 for selecting rows and second signal electrodes (bit lines) 16 for selecting columns are arranged to intersect at right angles. The first signal electrodes may be the bit lines and the second signal electrodes may be the word lines, differing from this example.

A ferroelectric layer 14 is disposed at least between the first signal electrodes 12 and the second signal electrodes 16, as shown in FIG. 2. Therefore, memory cells 20, each of which includes a ferroelectric capacitor, are formed at intersections between the first signal electrodes 12 and the second signal electrodes 16. The ferroelectric layer 14 is formed to be continuous between the adjacent memory cells, for example. Specifically, the ferroelectric layer 14 is continuously formed in the formation region of the memory cell array.

A peripheral circuit section 60 including a peripheral driver circuit for selectively allowing information to be written into or read from the memory cells and an amplifier circuit which for reading the information is also formed. The peripheral circuit section 60 includes a first driver circuit 50 for selectively controlling the first signal electrodes 12, a second driver circuit 52 for selectively controlling the second signal electrodes 16, and a signal detecting circuit (not shown) such as a sense amplifier, for example. As specific examples of the peripheral circuit section 60, a Y gate, a sense amplifier, an input-output buffer, an X address decoder, a Y address decoder, and an address buffer can be given.

The peripheral circuit section 60 may be formed by MOS transistors formed on a substrate (single crystal silicon substrate, for example). In the case where the substrate is formed of a single crystal silicon substrate, the peripheral circuit section 60 can be integrated on the same substrate as the memory cell array 100.

2. Hysteresis Curve

Figure 4:
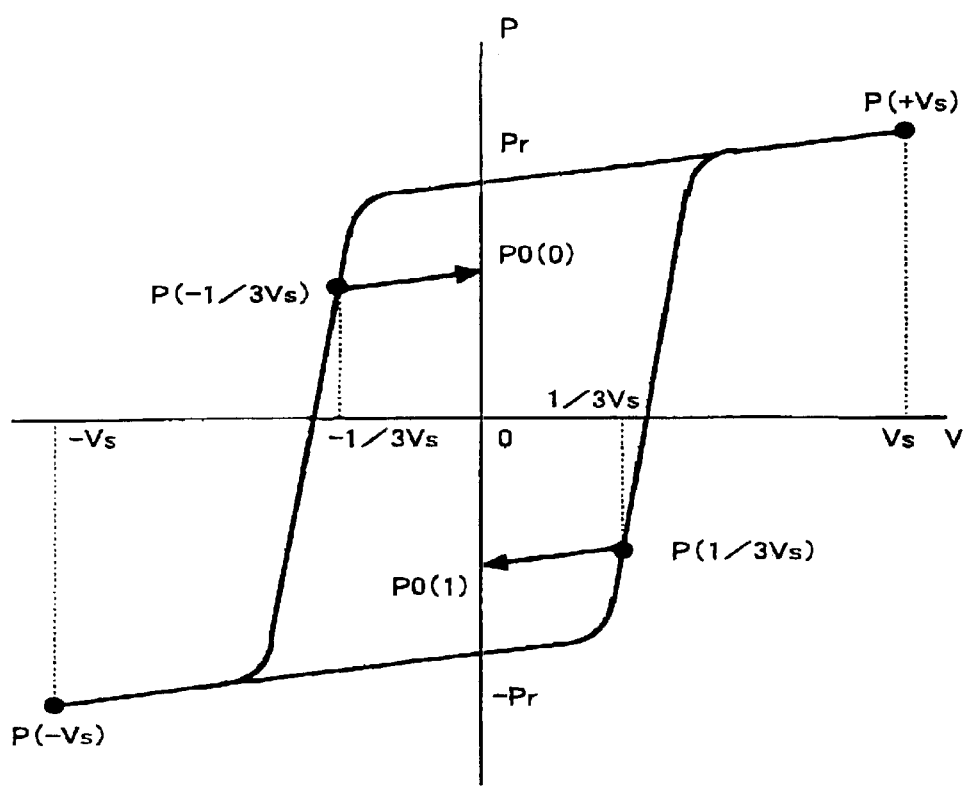
FIG. 4 is a view showing hysteresis characteristics of a ferroelectric capacitor.

The hysteresis curve of the ferroelectric capacitor according to the embodiment is described below. FIG. 4 is a view showing a P(polarization)-V (voltage) hysteresis curve of the ferroelectric capacitor.

This ferroelectric capacitor has a hysteresis curve as follows. When a voltage +Vs is applied, the polarization becomes P(+Vs). The polarization becomes Pr at an applied voltage of 0, P(−⅓Vs) at an applied voltage of −⅓Vs, and P(−Vs) at an applied voltage of −Vs. When the voltage is returned to 0, the polarization becomes −Pr. The polarization becomes P(+⅓Vs) at an applied voltage of +⅓Vs. When the voltage is returned to +Vs, the polarization returns to P(+Vs).

In the case where the applied voltage is changed to Vs (polarization P(+Vs)), to −⅓Vs, and to 0 using the ferroelectric capacitor according to the embodiment, the hysteresis loop follows a locus indicated by an arrow in FIG. 4, whereby the polarization has a stable value of P0(0). In the case where the applied voltage is changed to −Vs (polarization P(−Vs)), to +⅓Vs, and too, the hysteresis loop follows a locus indicated by an arrow in FIG. 4, whereby the polarization has a stable value of P0(1).

If the difference between P0(0) and P0(1) is secured sufficiently, the simple matrix type ferroelectric memory can be operated more reliably using the operation method disclosed in Japanese Patent Application Laid-open No. 9-116107 or the like. The following conditions can be given as conditions for the hysteresis loop whereby the ferroelectric memory can be operated reliably (difference between P0(0) and P0(1) is 2 $\mu C/cm^2$ or more, for example).

$$0.1 P(+Vs) < P(-\tfrac{1}{3}Vs) \tag{1}$$

$$0.1 P(-Vs) > P(+\tfrac{1}{3}Vs) \tag{2}$$

If the ferroelectric capacitor has a hysteresis loop which satisfies these conditions, the simple matrix type ferroelectric memory can be operated reliably.

When the applied voltage is changed from +Vs to −⅓Vs, P(0V)/P(Vs) may be greater than 0.6. When the applied voltage is changed from −Vs to +⅓Vs, P(0V)/P(−Vs) may be greater than 0.6. The greater the P(0V)/P(Vs) and P(0V)/P(−Vs), the closer the hysteresis loop to the square. Therefore, the closer the hysteresis loop is to square, the easier the hysteresis loop of the ferroelectric capacitor satisfies the conditions shown by the formulas (1) and (2). Therefore, the greater the P(0V)/P(Vs) and P(0V)/P(−Vs), the easier the hysteresis loop satisfies the conditions shown by the formulas (1) and (2). Specifically, the difference in polarization between P0(0) and P0(1) can be increased. As a result, the simple matrix type ferroelectric memory can be operated more reliably.

3. Material for Ferroelectric Layer

There are no specific limitations to the material for the ferroelectric layer insofar as the material has characteristics described relating to the hysteresis loop. The following materials can be given as examples.

(1) SBT ($SrBi_2Ta_2O_9$) may be used as the material for the ferroelectric layer. However, in the case of using SBT, the characteristics described relating to the hysteresis loop may not be satisfied because the coercive voltage is small.

The present inventors have found that the characteristics shown by the formulas (1) and (2) can be suitably satisfied by using $SrBi_2Nb_2O_9$ of which the coercive voltage is higher than that of SBT as the ferroelectric thin film. According to the experiments conducted by the present inventors, provided that the chemical formula of this material is shown by $SrBi_xNb_yO_z$, the above characteristics can be satisfied securely in the case where x, y, and z are 1.5 to 2.5, 1.5 to 2.5, and 7 to 11, respectively x, y, and z are still more preferably 1.8 to 2.2, 1.8 to 2.2, and 8.2 to 9.8, respectively. This enables the difference between P0(0) and P0(1) to be increased.

The characteristics shown by the formulas (1) and (2) can also be suitably satisfied by using a material in which $SrBi_2Ta_2O_9$ is solid dissolved in $SrBi_2Nb_2O_9$ as the ferroelectric thin film. According to the experiments conducted by the present inventors, provided that the chemical formula of this material is shown by $SrBi_x(Ta_wNb_{1-w})_yO_z$, the above characteristics can be satisfied securely in the case where x=1.5 to 2.5, y=1.5 to 2.5, z=7 to 11, and w=0 to 0.9. Still more preferably, x=1.8 to 2.2, y=1.8 to 2.2, z=8.2 to 9.8, and w=0 to 0.8. This enables the difference between P0(0) and P0(1) to be further increased.

(2) PZT (lead zirconate titanate, $Pb_x(Zr_{1-y}Ti_y)O_z$) may be used as the material for the ferroelectric layer. However, in the case of using Zr-rich rhombohedral PZT, the characteristics described relating to the hysteresis loop may not be satisfied because the coercive voltage is small.

The present inventors have found that the characteristics shown by the formulas (1) and (2) can be suitably satisfied by using $Ba_2NaNb_5O_{15}$, which is a compound having a tungsten bronze type crystal structure, as the ferroelectric thin film. According to the experiments conducted by the present inventors, using a structure in which Pt and $IrO_x$ are layered as a lower electrode, $Ba_2NaNb_5O_{15}$ deposited by a solution deposition process and subjected to crystal growth at 700° C. in oxygen atmosphere satisfies the above characteristics (P0(0)–P0(1)=5 $\mu C/cm^2$).

In the case of forming PZT with a (001) preferential orientation by changing the drying conditions for $Ba_2NaNb_5O_{15}$ deposited by a solution deposition process, specifically, in the case of forming PZT of which the strongest peak of a diffraction line determined by wide-angle XRD diffraction is present at the (001) plane, the difference between P0(0) and P0(1) was 5 to 20 $\mu C/cm^2$, whereby more desirable capacitor characteristics were obtained.

Materials having a tungsten bronze type crystal structure generally have no 90° domain. Therefore, these materials excel in squareness of the hysteresis loop in the direction of the polarization axis. The direction of the polarization axis is the (001) plane (C-axis). Therefore, squareness of the hysteresis loop can be improved by forming a material having a tungsten bronze type crystal structure with a (001) preferential orientation, whereby a hysteresis loop suitable for the operation of the simple matrix type ferroelectric memory can be obtained.

As the material, in addition to $Ba_2NaNb_5O_{15}$, $K_3Li_2Nb_5O_{15}$, and $(Sr,Ba)Nb_2O_6$, materials in which part of the Ba site of $Ba_2NaNb_5O_{15}$ is replaced by an element such as La or Li, and the like may be used.

(3) The present inventors have found that characteristics shown by the formulas (1) and (2) can be suitably satisfied by using Ti-rich tetragonal PZT having a large coercive voltage as the ferroelectric thin film. According to experiments conducted by the present inventors, in the case where PZT is deposited by a solution deposition process using a structure in which IrOx, Ir, and Ti are layered as the lower electrode, provided that the chemical formula of this material is shown by $Pb_x(Zr_{1-y}Ti_y)O_Z$, the above characteristics can be satisfied securely in the case where x=0.9 to 1.3, y=0.6 to 1.0, and z=2.8 to 3.4. Still more preferably, x=1.0 to 1.2, y=0.8 to 1.0, and z=3.0 to 3.2. This enables the difference between P0(0) and P0(1) to be further increased. In the case of using a single phase $PbTiO_3$ film (y=1.0), in particular, the difference between P0(0) and P0 (1) was about 50 $\mu C/cm^2$, whereby extremely desirable capacitor characteristics for the simple matrix type ferroelectric memory were obtained.

In the case of forming PZT (y=0.6) with a (001) preferential orientation by changing the drying conditions for PZT deposited by the solution deposition process, specifically, in the case of forming PZT of which the strongest peak of diffraction line determined by the wide-angle XRD diffraction is present at the (001) plane, the difference between P0(0) and P0(1) was 5 to 20 $\mu C/cm^2$ to obtain more desirable capacitor characteristics. At this time, the crystal structure of PZT was a tetragonal system.

4. Write/Read Method

An example of write and read operation of the ferroelectric memory device 1000 of the present embodiment is described below.

In the following description, a case of writing data by polarizing the ferroelectric capacitor by setting the potential of the bit line 16 higher than that of the word line 12 is defined as writing of data "1". A case of writing data by polarizing the ferroelectric capacitor by setting the potential of the word line 12 higher than that of the bit line 16 is defined as writing of data "0". The sign of a write voltage Vwrite is positive (+) when the potential of the bit line 16 is higher than that of the word line 12, and is negative (−) when the potential of the bit line 16 is lower than that of the word line 12. In other words, the data "1" is written when the positive write voltage Vwrite is applied between the bit line 16 and the word line 12, and the data "0" is written when the negative write voltage is applied between the bit line 16 and the word line 12.

The sign of a read voltage Vread is positive (+) when the potential of the bit line 16 is higher than that of the word line 12, and is negative (−) when the potential of the bit line 16 is lower than that of the word line 12.

4.1 Write Operation

An example of the write operation is described below. Note that all the selected memory cells are in a state of storing the data "0". All the selected memory cells may be caused to store the data "0" by applying the negative write voltage −Vwrite between the bit line 16 and the word line 12 in all the selected memory cells, for example. The absolute value of the negative write voltage −Vwrite is set less than the absolute value of the negative saturation voltage. The absolute value of the negative write voltage −Vwrite is preferably 90% or less, still more preferably 30 to 75%, and particularly preferably 45 to 60% of the absolute value of the negative saturation voltage.

The positive write voltage +Vwrite is applied between the bit line 16 and the word line 12 in the selected memory cell into which it is desired to write the data "1". The absolute value of the positive write voltage +Vwrite is set less than the absolute value of the positive saturation voltage. The absolute value of the positive write voltage +Vwrite is preferably 90% or less, still more preferably 30 to 75%, and particularly preferably 45 to 60% of the absolute value of the positive saturation voltage. During the write operation of the data "1", a voltage which does not cause polarization inversion of the selected memory cell in which it is desired to hold the data "0" is applied between the bit line 16 and the word line 12 in this selected memory cell. Therefore, since the polarization of the selected memory cell in which it is desired to hold the data "0" is not inverted, the data "0" is held.

When writing the data "1", a specific voltage is applied to the capacitors in the non-selected memory cells in order to prevent occurrence of crosstalk at the time of writing. Specifically, a first voltage which does not cause polarization inversion of the non-selected memory cells is applied between the bit line 16 and the word line 12 in the non-selected memory cells. The maximum absolute value of the first voltage is half the absolute value of the write voltage, and preferably one-third the absolute value of the write voltage, for example. The data "0" and data "1" can be written into the selected memory cells in this manner.

The write operation is not limited to the above example. The write operation may be modified as follows.

(1) After causing all the selected memory cells to store the data "1", the data "0" and data "1" may be written in to the selected memory cells by changing only the data of the specific selected memory cell into the data "0".

(2) The absolute value of the positive write voltage +Vwrite and the absolute value of the negative write voltage −Vwrite may be the same or different.

Technology disclosed in Japanese Patent Application Laid-open No. 9-116107 may be applied to the operation of the ferroelectric memory device, except for setting the absolute value of the write voltage less than the absolute value of the saturation voltage.

4.2 Read Operation

The read operation is described below.

A positive read voltage +Vread is applied between the bit line 16 and the word line 12 in the selected memory cells. At this time, current flowing through the selected bit line 16 or a potential when causing the bit line 16 to be in a high impedance state is read by the sense amplifier, whereby the data of the selected memory cells is read. In the read operation, data may be read by applying the negative read voltage −Vread.

The read operation may be allowed to serve as rewriting of the data "1" or "0". The absolute value of the read voltage +V write is less than the absolute value of the saturation voltage. The absolute value of the read voltage +Vwrite is preferably 90% or less, still more preferably 30 to 75%, and particularly preferably 45 to 60% of the absolute value of the saturation voltage. In this case, a specific voltage is applied to the capacitors in the non-selected memory cells in order to prevent occurrence of crosstalk during the read operation. Specifically, a second voltage which does not cause polarization inversion of the non-selected memory cells is applied between the bit line 16 and the word line 12 in the non-selected memory cells. The maximum absolute value of the second voltage is half the absolute value of the read voltage, and preferably one-third the absolute value of the read voltage, for example.

5. Effect

Effects of the ferroelectric memory device are described below.

In the present embodiment, the absolute value of the write voltage is set less than the absolute value of the saturation voltage. This enables the difference between switching polarization and non-switching polarization to be increased in comparison with the case of setting the write voltage the same as the saturation voltage. Therefore, the difference in bit line potential between reading of the data "1" and reading of the data "0" can be increased, where by malfunctions can be further decreased.

The greater the difference between the switching polarization and non-switching polarization, the more superior the squareness of the hysteresis loop. Therefore, the hysteresis loop of the ferroelectric capacitor easily satisfies the conditions shown by the formulas (1) and (2) by setting the absolute value of the write voltage less than the absolute value of the saturation voltage. Specifically, the difference in polarization between P0(0) and P0(1) can be increased. As a result, the ferroelectric memory device can be operated more reliably.

Figure 5:
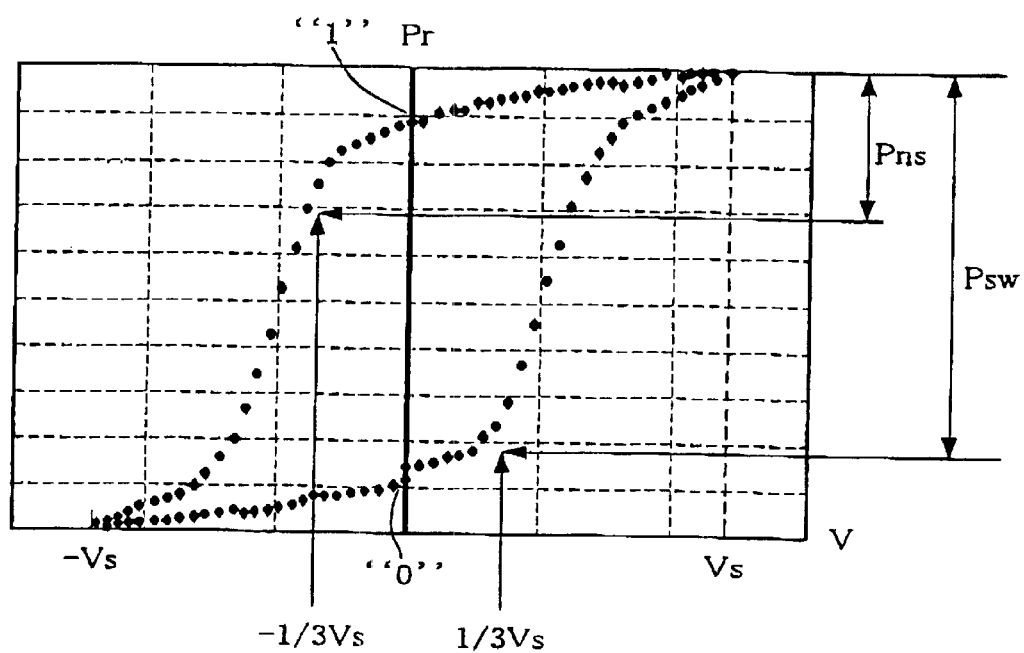
FIG. 5 is a graph showing the hysteresis characteristics of the ferroelectric capacitor for describing switching polarization and non-switching polarization.

Switching polarization and non-switching polarization are described below. FIG. 5 shows the hysteresis characteristics of the ferroelectric capacitor. In FIG. 5, Psw indicates the switching polarization, and Pns indicates the non-switching polarization. Specifically, in the case of reading data by changing the polarization state of the selected memory cell into the data "1", the switching polarization is the difference in polarization between before and after reading of the selected memory cell in which the data "0" is stored, and the non-switching polarization is the difference in polarization between before and after readings of the selected memory cell in which the data "1" is stored. In more detail, Psw is the difference in polarization in the case of reading data from the memory cell in which the data "0" is written by applying Vs to the memory cell to which (⅓) Vs is applied. Pns is the difference in polarization in the case of reading data from the memory cell in which the data "1" is written by applying Vs to the memory cell to which (−⅓) Vs is applied In the case where the absolute values of the first voltage and the second voltage applied to the non-selected memory cells are half the absolute values of the write voltage and the read voltage, respectively, Psw is the difference in polarization in the case of reading data from the memory cell in which the data "0" is written by applying Vs to the memory cell to which (½) Vs is applied, and Pns is the difference in polarization in the case of reading data from the memory cell in which the data "1" is written by applying Vs to the memory cell to which (−½) Vs is applied.

Figure 6:
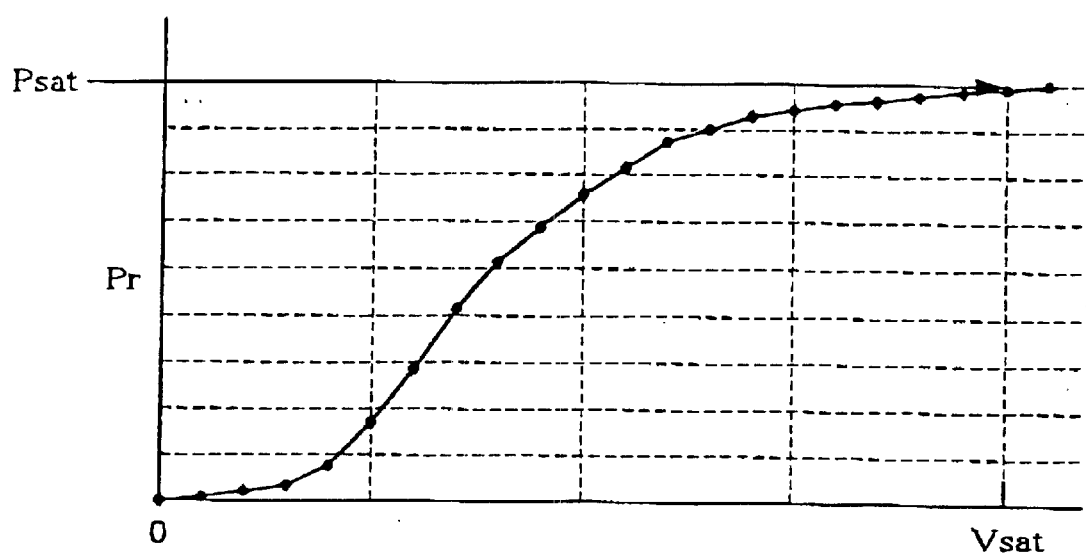
FIG. 6 is a graph showing a relation between a voltage applied between a bit line and a word line and polarization for describing a saturation voltage.

Saturation voltage is defined below. The saturation voltage is a voltage at which the remanent polarization of the ferroelectric capacitor is saturated. Specifically, when increasing the potential of the bit line with respect to the word line, the positive saturation voltage is a voltage at which the polarization Pr is not increased even if the potential is further increased. More specifically, the positive saturation voltage is an applied voltage Vsat at saturation polarization Psat shown in FIG. 6. On the contrary, when decreasing the potential of the bit line with respect to the word line, the negative saturation voltage is a voltage at which the polarization Pr is not decreased even if the potential is further decreased.

6. Example of Structure of Ferroelectric Memory

Figure 7:
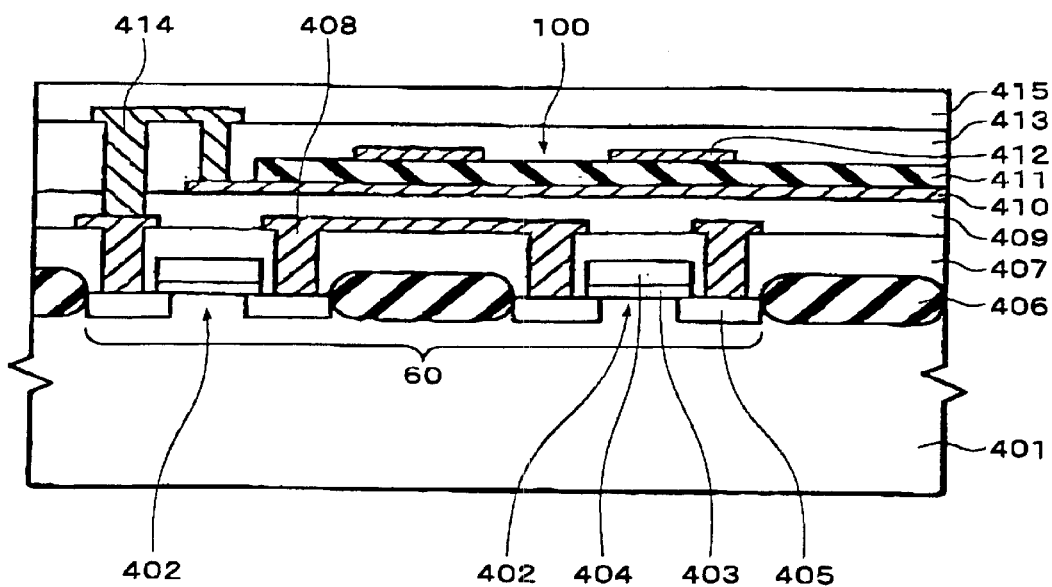
FIG. 7 is a cross-sectional view schematically showing a structure of a ferroelectric memory device according to the present embodiment.

FIG. 7 is a cross-sectional view schematically showing the structure of a ferroelectric memory device according to the present embodiment.

An example in the case where the memory cell array 100 and the peripheral circuit section 60 are formed on a single substrate is described below.

The memory cell array 100 and the peripheral circuit section 60 are formed in different layers. The degrees of freedom relating to the formation position of the memory cell array 100 and the peripheral circuit section 60 are increased by forming the memory cell array 100 and the peripheral circuit section 60 in different layers. In this example, the peripheral circuit section 60 is formed in a lower layer and the memory cell array 100 is formed in an upper layer.

The peripheral circuit section 60 is formed by MOS transistors 402 formed on a single crystal silicon substrate 401. Each of the MOS transistors 402 includes the single crystal silicon substrate 401, source/drain regions 405, a gate insulating film 403, and a gate electrode 404. Each of the MOS transistors 402 is isolated from the others by element isolation oxide films 406. A first interlayer dielectric 407 is formed on the substrate 401. A first interconnect layer 408 is formed on the first interlayer dielectric 407.

A second interlayer dielectric 409 is formed on the first interlayer dielectric 407 and the first interconnect layer 408. The memory cell array 100 is formed on the second interlayer dielectric 409. The memory cell array 100 includes lower electrodes (word lines or bit lines) 410, a ferroelectric thin film 411, and upper electrodes (bit lines or word lines) 412. A third interlayer dielectric 413 is formed on the memory cell array 100. The memory cell array 100 and the peripheral circuit section 60 are electrically connected through a second interconnect layer 414. A protection film 415 is formed on the third interlayer dielectric 413. The memory cell array 100 and the peripheral circuit section 60 can be integrated on the single substrate in this manner. The memory cell array 100 may be formed either to overlap or not to overlap the peripheral circuit section 60 in a plan view.

In the structure shown in FIG. 7, the memory cell array 100 is formed on the peripheral circuit section 60. However, the memory cell array may not be disposed on the peripheral circuit section and may be in contact with the peripheral circuit section on a plane.

In the above example, the interconnect layer 408 in the peripheral circuit section 60 may be formed using a material having high heat resistance such as Cu or an alloy containing Cu as an essential component. This prevents occurrence of hillocks on the metal interconnect layer 408 even if the ferroelectric layer 411 is crystallize data temperature of about 600° C. This metal interconnect layer may be formed using Mo, W, or the like in addition to the Cu-based material. In a device in which a CPU, SRAM, logic circuit, and the like are embedded in this ferroelectric memory device, the metal inter connect layer may be formed using Cu or an alloy containing Cu as an essential component.

7. Method of Fabricating Memory Cell Array

An example of a method of fabricating the above-described memory cell array is described below with reference to FIG. 3.

The first signal electrodes 12 are formed on a substrate 10. As a material for the first signal electrodes 12, Ir, $IrO_x$, Pt, $RuO_x$, $SrRuO_x$, and $LaSrCoO_x$ can be given. As a method of forming the first signal electrodes 12, sputtering, vapor deposition, and the like can be given. The first signal electrodes 12 may have either a single layer structure or a multilayer structure in which a plurality of layers is provided.

The first signal electrodes 12 are patterned by etching. As a method of etching the first signal electrodes 12, RIE, sputter etching, plasma etching, and the like can be given.

The ferroelectric layer 14 is formed on the substrate 10 on which the first signal electrodes 12 are formed. As a material for the ferroelectric layer, perovskite-type oxide ferroelectrics (such as $SrBi_2Ta_2O_9$) can be given. In the case of using $SrBi_2Ta_2O_9$, the relative dielectric constant of the material is 250 to 400 in a state in which a bias voltage is not applied, although the value varies depending on unevenness of the composition, production method, and the like. There are no specific limitations to the material for the ferroelectric layer 14. A material having a relative dielectric constant of preferably 400 or less, and still more preferably 300 or less in a state in which the bias voltage is not applied is used. As the material for the ferroelectric layer 14, in addition to $SrBi_2Ta_2O_9$, SBT materials having different compositions of the same elements, $SrBi_2Nb_2O_9$ materials, and the like may be used. As the method of forming the ferroelectric layer 14, a spin coating process or a dipping process using a sol-gel material or MOD material, a sputtering process, an MOCVD process, and a laser ablation process can be given. There are no specific limitations to the thickness of the ferroelectric layer. Provided that the absolute value of the write voltage is |Vwrite| (V) and the thickness of the ferroelectric layer is T1 ($\mu$m), it is preferable that the thickness of the ferroelectric layer satisfy the following relational equation. Specifically, the thickness of the ferroelectric layer preferably satisfies $|Vwrite|/T1 \leq 17$ (V/$\mu$m), and still more preferably $|Vwrite|/T1 \leq 15$ (V/$\mu$m).

The ferroelectric layer 14 is patterned by etching.

The second signal electrodes 16 are formed on the ferroelectric layer 14. As a material and a formation method for the second signal electrodes 16, a material and a method the same as those for the first signal electrodes 12 maybe applied. The second signal electrodes 16 are patterned by etching. As a method of etching the second signal electrodes 16, a method the same as that for the first signal electrodes 12 maybe applied. The memory cell array 100 is formed in this manner.

8. Modification Example

The above embodiment may be modified as follows.

In the above embodiment, the ferroelectric layer 14 is continuously formed in the formation region of the memory cell array 100. However, the present embodiment is not limited thereto. The embodiment may have any of the following features. 1) The ferroelectric layers 14 may be formed linearly along the first electrodes 12. 2) The ferroelectric layers 14 may be formed linearly along the second electrodes 16. 3) The ferroelectric layers 14 may be formed only at intersections between the first electrodes 12 and the second electrodes 16.

Figure 8:
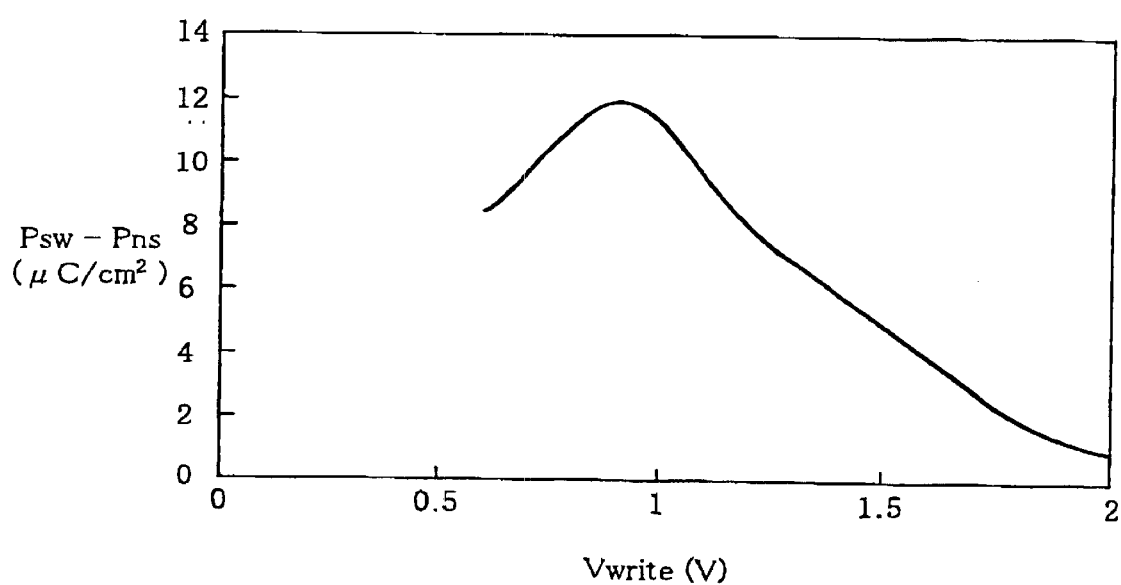
FIG. 8 is a graph showing the relation between a write voltage Vwrite and Psw−Pns.
Figure 9:
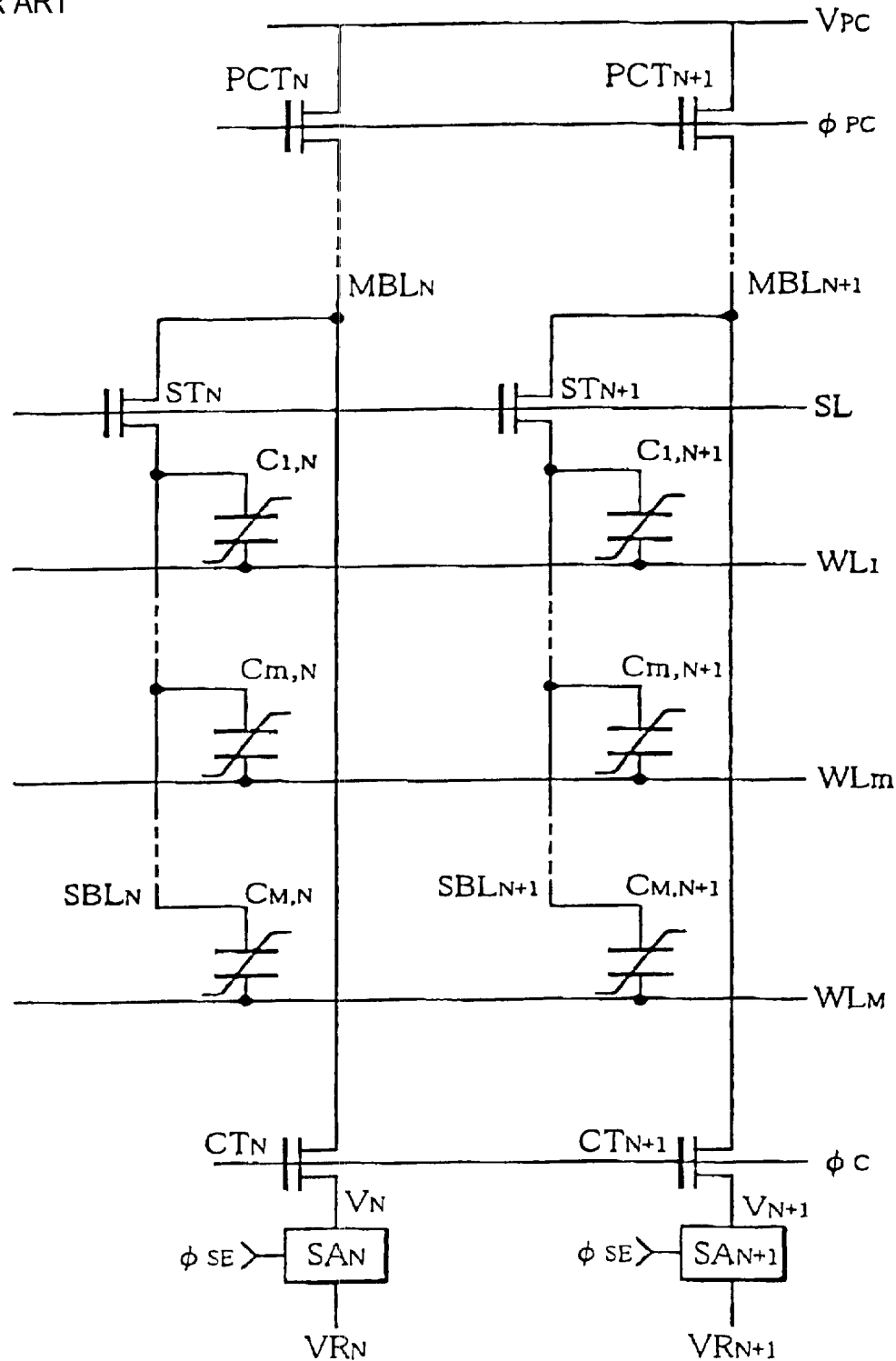
FIG. 9 is a view showing a memory cell array of a ferroelectric memory device according to a conventional example.
Figure 10:
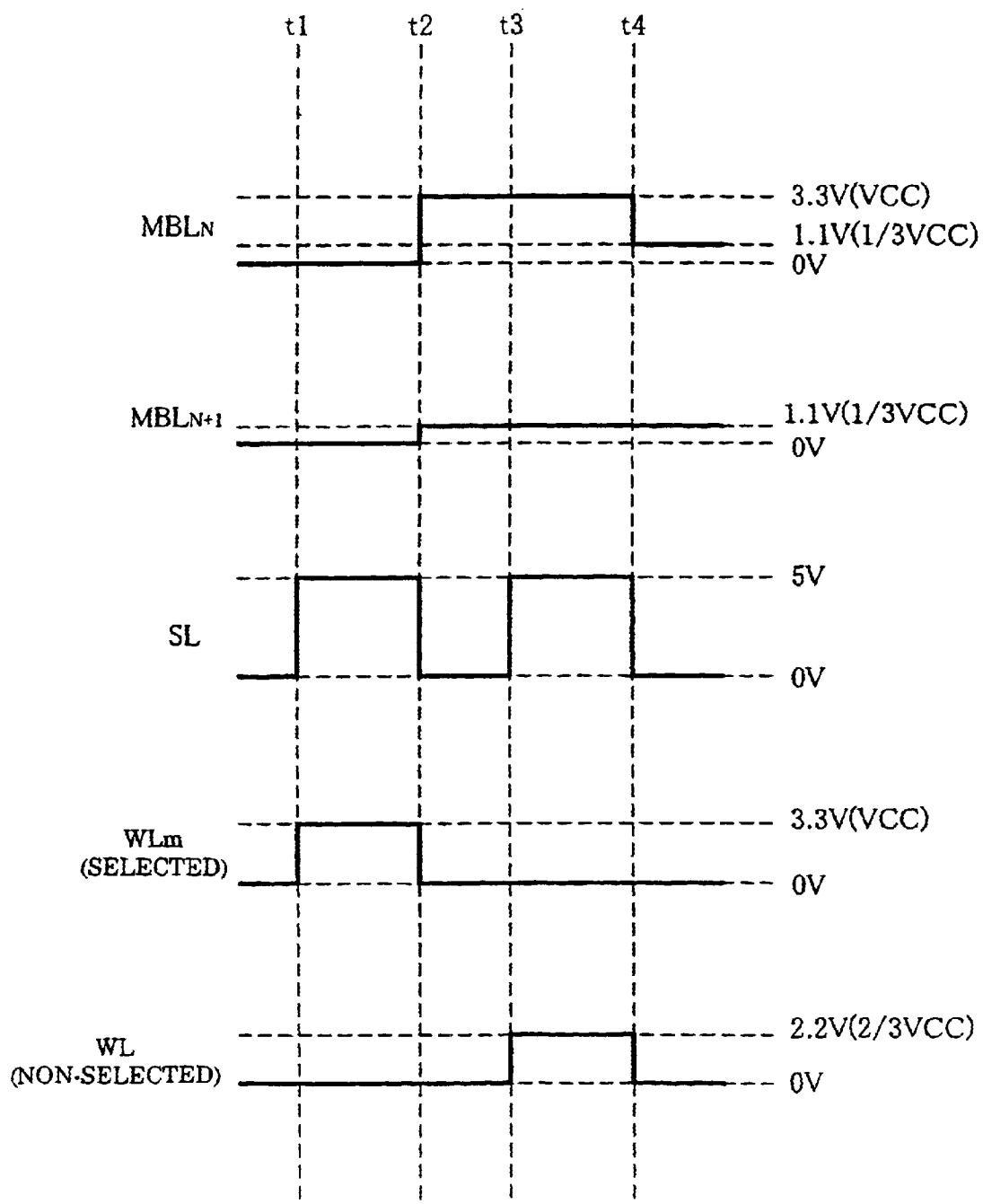
FIG. 10 is a timing chart in the case of writing data "1" into a ferroelectric capacitor Cm,N and writing data "0" into Cm, N+1.
Figure 11:
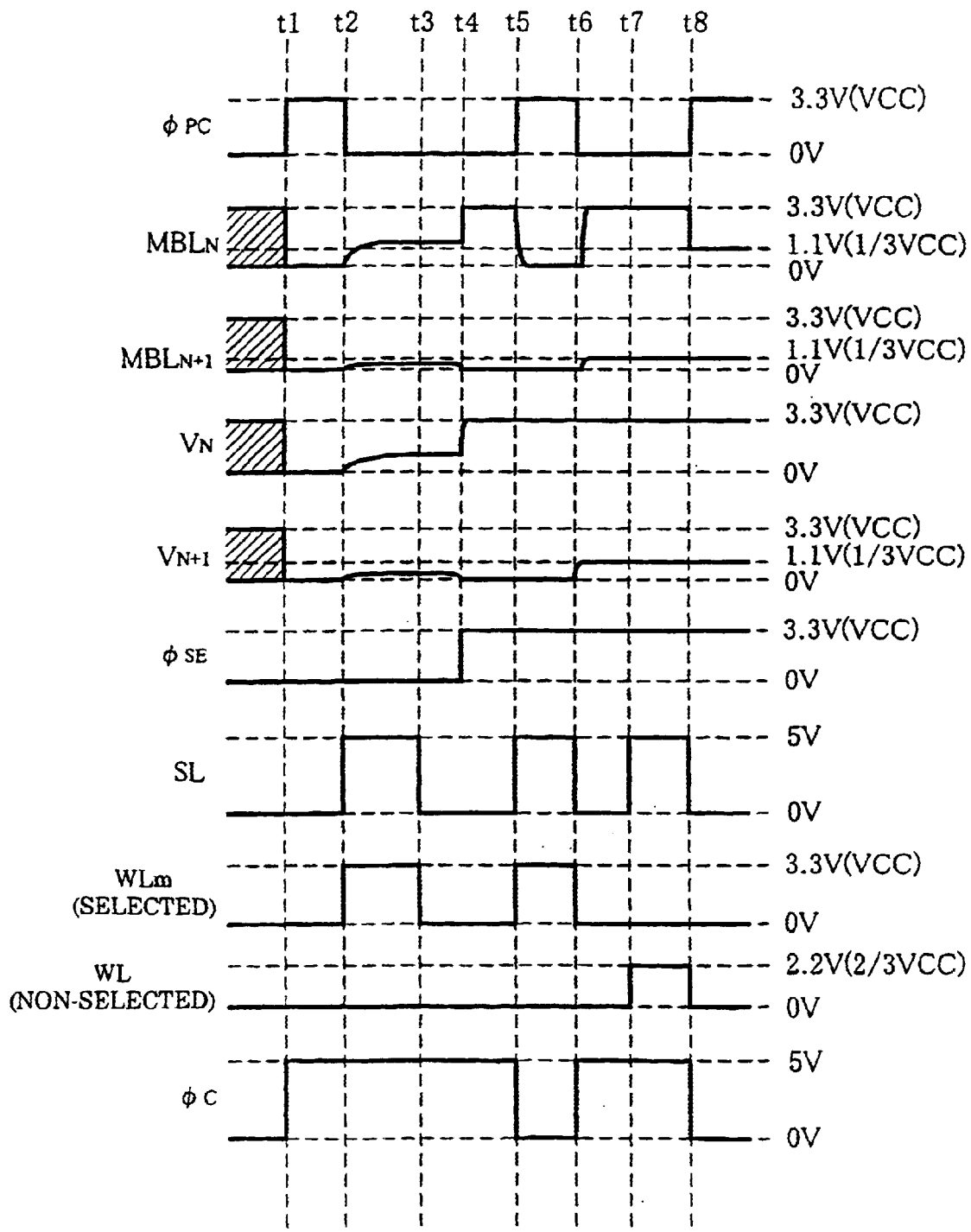
FIG. 11 is a timing chart in the case of reading data "1" stored in the memory cell Cm,N and reading data "0" stored in the memory cell Cm,N+1, and rewriting data "1" into the memory cell Cm,N and rewriting data "0" into the memory cell Cm,N+1.

9. Experimental Example (1) The relation between the difference between the switching polarization and the non-switching polarization (Psw–Pns) and the write voltage Vs was examined. FIG. 8 is a graph showing the relation between the difference between the switching polarization and the non-switching polarization and the write voltage. Table 1 shows data on the difference between the switching polarization and non-switching polarization corresponding to the write voltage. Psw is the difference in polarization in the case of reading data from the memory cell in which the data "0" is written by applying Vs to the memory cell to which (⅓) Vs is applied. Pns is the difference in polarization in the case of reading data from the memory cell in which the data "1" is written by applying Vs to the memory cell to which (–⅓) Vs is applied.

The experiment was conducted under the following conditions. The material for the ferroelectric layer was $SrBi_2Ta_2O_9$. The thickness of the ferroelectric layer was 120 nm. The saturation voltage of the ferroelectric layer was 2.0 V.

As is clear from FIG. 8, in the case where the write voltage Vwrite is less than 2.0 V (saturation voltage), Psw–Pns is increased in comparison with the case where the write voltage Vwrite is 2.0 V. Therefore, Psw–Pns is increased when the write voltage is less than the saturation voltage.

TABLE 1

| Vs (V) | Psw - Pns ($\mu$C/cm$^2$) |
|---|---|
| 0.6 | 8.5 |
| 0.9 | 12.0 |
| 1.2 | 8.0 |
| 1.5 | 5.0 |
| 1.8 | 2.0 |

(2) The relation between the relative dielectric constant of the material for the ferroelectric layer and the difference between the switching polarization and the non-switching polarization (Psw–Pns) was examined. Table 2 shows data on the difference between the switching polarization and non-switching polarization (Pws–Pns) corresponding to the relative dielectric constant of the material for the ferroelectric layer.

In this experiment, the relative dielectric constant is a value when the bias voltage is 0 V. The ferroelectric layer was formed using a solution deposition process. The thickness of the ferroelectric layer was 120 nm. The write voltage was 1.2 V.

As is clear from Table 2, the difference between the switching polarization and non-switching polarization (Pws−Pns) is increased as the relative dielectric constant is decreased.

TABLE 2

| Material | Relative dielectric constant | Psw - Pns ($\mu C/cm^2$) |
|---|---|---|
| $SrBi_2Ta_2O_9$ | 300 | 8.0 |
| $SrBi_2Ta_{1.8}Nb_{0.2}O_9$ | 250 | 10.0 |
| $SrBi_2Nb_2O_9$ | 170 | 13.0 |

The present invention is not limited to the above embodiment. Various modifications and variations are possible within the scope of the present invention.

What is claimed is:

1. A ferroelectric memory device comprising:
   a memory cell array, in which memory cells are arranged, in a matrix, which comprises first signal electrodes, second signal electrodes arranged in a direction which intersects with the first signal electrodes, and a ferroelectric layer disposed at least in intersecting regions in which the first signal electrodes intersect with the second signal electrodes,
   wherein, provided that the maximum absolute value of a voltage applied between one of the first signal electrodes and one of the second signal electrodes is Vs, a polarization value P of a ferroelectric capacitor comprising one of the first signal electrodes, one of the second signal electrodes, and the ferroelectric layer is within the range of:

$$0.1P(+Vs) < P(-\tfrac{1}{3}Vs)$$

when the applied voltage is changed from +Vs to −⅓Vs, and $$0.1P(-Vs) > P(+\tfrac{1}{3}Vs)$$

when the applied voltage is changed from −Vs to +⅓Vs.

2. The ferroelectric memory device according to claim 1, wherein the ferroelectric layer comprises a compound containing at least Sr, Bi, Nb, and O as constituent elements.

3. The ferroelectric memory device according to claim 2, wherein the compound has the formula:

$$SrBi_xNb_yO_z$$

wherein x=1.5 to 2.5, y=1.5 to 2.5, and z=7 to 11.

4. The ferroelectric memory device according to claim 2, wherein the compound has the formula:

$$SrBi_x(Ta_wNb_{1-w})_yO_z$$

wherein x=1.5 to 2.5, y=1.5 to 2.5, z=7 to 11, and w=0 to 0.9.

5. The ferroelectric memory device according to claim 1, wherein the ferroelectric layer comprises a compound without 90° domain.

6. The ferroelectric memory device according to claim 5, wherein the ferroelectric layer comprises a compound having a tungsten bronze type crystal structure.

7. The ferroelectric memory device according to claim 5, wherein the ferroelectric layer formed using the compound has the strongest peak of an XRD diffraction line determined using a wide-angle method at the (001) plane.

8. The ferroelectric memory device according to claim 1, wherein the ferroelectric layer comprises a compound containing at least Pb, Ti, and O as constituent elements.

9. The ferroelectric memory device according to claim 8, wherein the ferroelectric layer comprises a single phase compound.

10. The ferroelectric memory device according to claim 1, wherein the ferroelectric layer comprises a compound containing at least Pb, Ti, Zr, and O as constituent elements.

11. The ferroelectric memory device according to claim 10, wherein the compound has the formula:

$$Pb_x(Zr_{1-y}Ti_y)O_z$$

wherein x=0.9 to 1.3, y=0.6 to 1.0, and z=2.8 to 3.4.

12. The ferroelectric memory device according to claim 11, wherein the crystal structure of the compound belongs to a tetragonal system.

13. The ferroelectric memory device according to claim 11, wherein the ferroelectric layer formed using the compound has the strongest peak of an XRD diffraction line determined using a wide-angle method at the (001) plane.

14. The ferroelectric memory device according to claim 1, wherein information is written into a selected memory cell by applying a write voltage between one of the first signal electrodes and one of the second signal electrodes in one of the memory cells, and
   an absolute value of the write voltage is less than an absolute value of a saturation voltage at which the remanent polarization of the ferroelectric capacitor is saturated.

15. The ferroelectric memory device according to claim 14, wherein information is read from a selected memory cell by applying a read voltage between one of the first signal electrodes and one of the second signal electrodes in one of the memory cells, and
   an absolute value of the read voltage is less than an absolute value of a saturation voltage.

16. The ferroelectric memory device according to claim 15, wherein the absolute value of the write voltage is the same as the absolute value of the read voltage.

17. The ferroelectric memory device according to claim 1, wherein information is written into a selected memory cell by applying a write voltage between one of the first signal electrodes and one of the second signal electrodes in one of the memory cells,
   wherein information is read from a selected memory cell by applying a read voltage between one of the first signal electrodes and one of the second signal electrodes in one of the memory cells, and
   wherein, provided that the write voltage is +Vs and the read voltage is one of +Vs and −Vs,
   |Vs| is less than an absolute value of a saturation voltage at which the remanent polarization of the ferroelectric capacitor is saturated.

18. The ferroelectric memory device according to claim 1, wherein, with regard to the polarization P of the ferroelectric capacitor, wherein P(0V)/P(Vs) is greater than 0.6, when the applied voltage is changed from +Vs to $-\frac{1}{3}$Vs, and wherein P(0V)/P(-Vs) is greater than 0.6, when the applied voltage is changed from -Vs to $+\frac{1}{3}$Vs.

19. The ferroelectric memory device according to claim 1, wherein the memory cell array is integrated on a single substrate together with a peripheral circuit.

20. The ferroelectric memory device according to claim 19, further comprising:

a peripheral circuit section which selectively writes information into or reads information from the memory cells, wherein the memory cell array and the peripheral circuit section are disposed in different layers.

21. The ferroelectric memory device according to claim 20, wherein at least interconnecting lines in the peripheral circuit section are formed of Cu or an alloy containing Cu as an essential component.

* * * * *